United States Patent [19]

Bhargava

[11] Patent Number: 5,446,286
[45] Date of Patent: Aug. 29, 1995

[54] ULTRA-FAST DETECTORS USING DOPED NANOCRYSTAL INSULATORS

[76] Inventor: Rameshwar N. Bhargava, 5 Morningside Ct., Ossining, N.Y. 10562

[21] Appl. No.: 228,821

[22] Filed: Aug. 11, 1994

[51] Int. Cl.$^6$ .......................... G01T 1/20; H01L 31/12
[52] U.S. Cl. .................... 250/361 R; 257/17
[58] Field of Search .......... 250/361 R, 363.01, 370.01, 250/370.11, 483.1; 257/17

[56] References Cited

U.S. PATENT DOCUMENTS 5,293,050 3/1994 Chapple-Sokol et al. ............ 257/17

FOREIGN PATENT DOCUMENTS 0467044 1/1992 European Pat. Off. ........ 250/361 R

*Primary Examiner*—Davis L. Willis
*Assistant Examiner*—Richard Hanig

[57] ABSTRACT

An efficient and ultrafast sensor for X-ray and UV radiation based on doped nanocrystals. These doped nanocrystals consist preferably of impurity-activator doped wide band gap II–VI semiconductors. They yield high efficiency and short recombination time radiation-sensitive phosphors which in response to radiation emit visible light easily detected by conventional sensors such as Si sensors. The combination of pulsed UV/X-ray sources with efficient and ultrafast sensors will yield sensors with increased signal to noise ratio. In a preferred embodiment, thin films of doped nanocrystals are used for generating visible radiation, which can be imaged with a conventional Si-based camera. Other applications also include the use of doped nanocrystals of piezoelectric materials to sense pressure, of pyroelectric materials to sense heat, and of ferroelectric materials to sense electric fields.

26 Claims, 7 Drawing Sheets

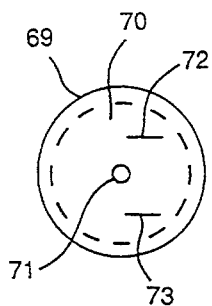 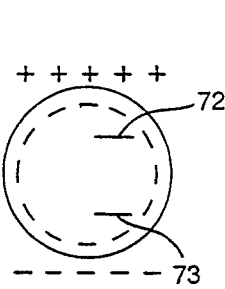 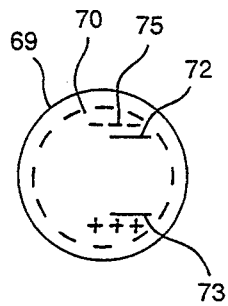 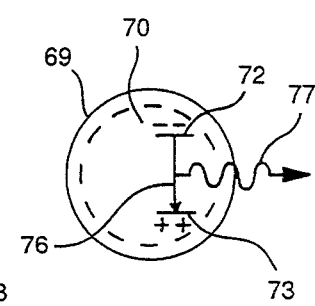
Fig. 13a    Fig. 13b    Fig. 13c    Fig. 13d
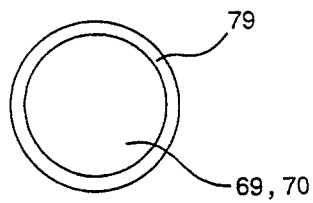 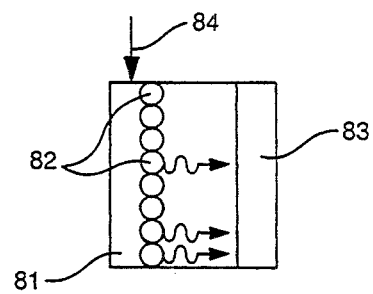
Fig. 14    Fig. 15
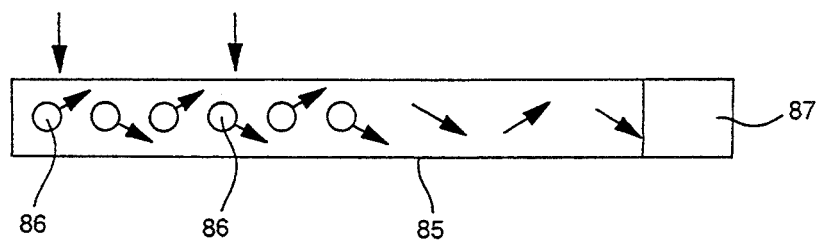
Fig. 16
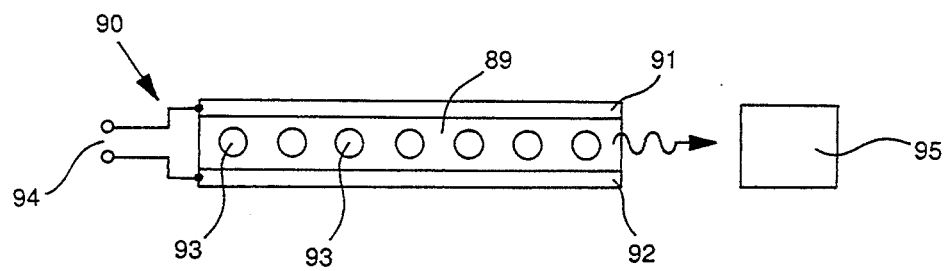
Fig. 17

ULTRA-FAST DETECTORS USING DOPED NANOCRYSTAL INSULATORS

RELATED APPLICATIONS

Commonly-owned, copending application, Ser. No. 08/246,944, filed May 20, 1994, entitled "Pumped Solid-State Lasers Comprising Doped Nanocrystal Phosphors".

Commonly-owned, copending application, Ser. No. 08/185,191, filed Jan. 24, 1994, entitled "Light-Emitting Device".

Commonly-owned, copending application, Ser. No. 08/225,613, filed Apr. 11, 1994, entitled "Displays Comprising Doped Nanocrystal Phosphors".

BACKGROUND OF THE INVENTION

This invention relates to sensors or detectors for radiation, including light, X-rays and heat, and for pressure and electric fields.

Sensors for various kinds of radiations are known in the art, but they are deficient in a number of different ways. For example, the photoresponse of known semiconductor sensors in the ultraviolet (UV) and X-ray radiation range is limited due to surface recombination.

The radiation with energy more than a few hundred meV above the band gap will be absorbed in a thin layer ($\sim 100$ Å deep) near the surface. The photogenerated free carriers due to I/V/X-ray absorption recombine non-radiatively in the vicinity of the surface of the semiconductor. This is in contrast to visible/infrared (IR) radiation where the absorption length of the radiation is significantly larger and the recombination occurs deeper in the bulk away from the surface. The carrier recombination at the surface may be avoided by one of the following schemes: (i) by passivating the surface of the semiconductor using a chemical treatment. For example, in porous Si the surface recombination velocities could be reduced to as low as 0.1 cm/sec in HF-treated surface and significant light emission can be observed; or (ii) the surface of the semiconductor absorber in question can be passivated using hetero-junction schemes. This is evidenced in many III–V semiconductor devices.

The above two schemes are not available when the impinging radiation is of very high energy (even compared to passivating- layer band gap) such as of UV, X-ray and synchrotron radiation. In all of the above, the detection of the photo-generated carriers is observed via a scintillation process using an impurity or dopant ion as a luminescent center. This energy transfer of carriers between the host to the luminescent center is not very efficient. The reasons for the low efficiency, in the most simple yet instructive description, is that the radiation-generated electron and hole in the host material are not localized. Their wavefunction is spread out over a range comparable to the excitonic Bohr radius of the material, $a_B$ ($\sim 100$ Å in semiconductors). On the other hand, the optically-active electron of the dopant ion belonging to the shielded f (rare earth) or d (transition metals) shell, is localized in a radius of only a few angstroms. Thus, the overlap of the wave functions between the host and donor is small, and thus the probability of transition between them is much smaller than the probability of recombination. A more detailed study reveals that in the vicinity of the dopant atom, the wave function of the electron in the conduction band has an s-orbital shape and the wave function of the hole in the valence band has a p-orbital shape. Since the impurity electron has a d-orbital or f-orbital shape, some of the transitions are prohibited by symmetry conservation.

Present time chest x-rays are not available for the early diagnosis of, for example, breast cancer because of its relatively high, 0.1 rad, dosage. In principle, a dosage reduction while preserving the quality of the image would offer the benefit of using early x-ray diagnostics with appropriate frequency. In addition, it is imperative to have a high resolution technique to detect a lump on a much smaller scale. Also, radiographic imaging remains unattractive because the films consumed are highly uneconomical. On the other hand, one can digitize the X-ray image to the resolution needed for a CRT display, yet the signal to noise ratio in the CRT itself limits the final resolution. Besides developing a high brightness and high resolution CRT, it is necessary to improve the detection methods and sensitivity currently available in X-ray imaging for lower X-ray dosage. To improve detection sensitivity, a large effort is devoted to collimating the X-rays by different techniques which allow to reduce the $1/R^2$ loss of the intensity to a minimum. For example, development in the area of Kulakov lens and a free electron laser source for improved X-ray collimated source are being considered for the next generation of high resolution and low dosage systems. Simultaneously radiation-hardened detectors based on charge-injection devices are being developed. These can withstand a higher X-ray exposure for a prolonged time. However the size of the detector limits the overall resolution. For mammography applications, a detector size of at least 10 cm $\times$ 10 cm is required.

SUMMARY OF THE INVENTION

An object of the invention is an improved solid-state sensor or detector device.

Another object of the invention is a sensor for radiation exhibiting higher sensitivity, higher efficiency, or both.

A further object of the invention is an improved sensor for UV radiation.

Still another object of the invention is an X-ray sensor exhibiting one or more of higher signal to noise ratio, lower X-ray dosage, at least 10 cm by 10 cm size of active area, or improved lifetime under X-ray exposure.

Other objects of the invention include improved sensors for pressure, heat, and electric fields. The invention is based upon the following new understandings and discoveries. In order to increase the efficiency and the transfer rate to the luminescent center, the dimensions of the host crystal are reduced to less than $a_B$, where $a_B$ is the e-h Bohr radius, whereupon it is found that the properties of the host-activator system undergo dramatic changes that alleviate many of the problems described above, leading to ultrafast and efficient UV/X-ray detectors. In accordance with one aspect of the present invention, I confine the active impurity in a nanometer-sized crystalline particle (herein "nanocrystal") and thus down-convert the UV/X-ray radiation efficiently to visible/IR radiation which can be detected with known optoelectronic detectors such as Si or III–V based detectors.

The improved performance results from the following factors:

1. The bandgap of the host material increases with quantum confinement. The absorption of the radiation in a quantum dot increases as $(a_B/R)^3$ where R is the radius of the nanocrystal. Thus the bandgap absorption can be enhanced significantly by fabricating the quantum-particles of sizes much smaller than $a_B$. This enhanced absorption in these particles allows the use of thin layers of nanocrystalline materials, for example, 1000 Å or less, resulting also in increased resolution.

2. The absorption in the nanocrystalline host material increases with decreasing size of the host particles, thereby providing better matching to the impinging radiation.

3. When an impurity is incorporated in a nanocrystal, the photo-generated carriers are localized within a short distance from the impurity atoms increasing the probability of their interaction [5]. The bracketed numbers are identified in an annexed Appendix which lists the references. The full contents of these references [1–16] and the contents of the three related applications identified above are herein incorporated by reference.

4. Prompted by the confinement, the shapes of the electronic wavefunctions of both host and impurity lose their atomic-like "purity" and mix with each other—the so-called hybridization takes place [11]. This further increases the probability of their interaction dramatically.

5. The increased interaction between the host and the impurity electrons increases the transfer rate of the electrons from host to the impurity by several orders of magnitude. This tranfer time can be as low as 20 psec or less.

6. The strength of the atomic radiative transition can be increased many-fold by the hybridization [5–7]. I have observed a decrease of six orders of magnitude in the lifetime of the trapped electron in ZnS:Mn doped nanocrystals.

The application of these principles in accordance with another aspect of the invention leads to a new class of X-ray phosphors where not only the quantum efficiecy is high but also the phosphors are ultra-fast. This ultrafast speed in the picosecond range results in systems which may yield the depth information of a scatterer under X-ray exposure. This would allow the use of known time-coincidence techniques which would also reduce the X-ray dosage significantly. The advantages of these new systems are:

The X-ray phosphors are Pb-based doped nanocrystals (hereinafter referred to as DNC), Enhanced X-Ray absorption in thin films of Pb-based DNC, Ultrafast transfer of X-ray excited electrons from Pb based DNC to $Eu^{3+}$ impurity, Efficient and fast generation of red light from $Eu^{3+}$ $5d$–$7f$ transition, Direct imaging of red light onto a CCD camera, The system can include known coincidence-detection using pulsed X-ray sources leading to significant enhancement of signal to noise ratio, X-ray sensors with detection speeds less than 1 nsec are possible.

In accordance with a further aspect of the present invention, a solid-state sensor or detector for radiation comprises an active layer comprising DNC. By "DNC" is meant quantum-confined, separated, tiny, insulating particles with nanometer dimensions, typically 100 Å or less in size, of certain insulating materials activated with certain activators, which, when excited by incident radiation, will efficiently emit another radiation characteristic of the activator. Since the insulating particles are very small, a layer that is several of such particles thick can be made very thin, of the order of 1000 Å or less.

In accordance with a preferred aspect of the present invention, DNC insulating layers as the active layer of a detector are prepared of doped nanocrystalline 2 to 5 nm particles of insulating and solid-state materials. A preferred group is wide bandgap II–VI semiconductors and insulators prepared by room temperature chemistry. By "wide band gap" is meant greater than 2.0 eV. Examples of suitable host materials include members of the II–VI family of compounds, such as ZnO, ZnS, ZnSe, CdS, CdSe, insulating metal oxides such as yttrium oxide and yttrium oxysulphide, and high atomic weight compounds such as PbS and PbO which show a wide band gap for particle sizes<30 Å. These latter semicoductors as bulk materials have narrow energy band gaps typicaly below 0.5 eV. However, when prepared as nanocrystals of size less than about 30 Å, their energy band gap increases to greater than 2.0 eV, putting them in the category of wide band gap materials. Examples of suitable activators include the rare earth ions and the transition metal ions. For example, DNC powder of $ZnS:Mn^{2+}$ shows characteristic yellow emission of the Mn activator [5]. Besides high efficiency, these doped nanocrystalline particles yield extremely fast luminescent lifetime which is about six orders of magnitude faster than in the bulk phosphors [5]. This demonstrates that in DNC, impurity associated emission can be very efficient and fast due to electron-hole localization at the impurity [4]. The preferred materials as a sensor for X-ray and UV radiation are DNCs consisting of rare-earth doped wide band gap II–VI semiconductors.

In accordance with another aspect of the present invention, considering the host DNC particle as a cage for the dopant ions, by controlling the size of the cage by controlling the size of the DNC particle, it becomes possible to substantially match the excited energy levels for electrons in the host to the corresponding excited atomic energy levels in the ions. When this is achieved, a resonant energy transfer occurs, i.e., the transfer of carriers from host to dopant ions occurs almost instantaneously (within nanoseconds) and efficiently without any loss of energy.

Measurements conducted to date on certain of the materials mentioned above yield efficiency over 20% and recombination times <20 psec.

In accordance with another aspect of the present invention, the DNC are constituted of a pyroelectric material. When heat radiation is incident on a layer of such particles, visible radiation will be emitted that can be detected by a conventional light detector. A device combining the DNC pyroelectric layer with the light detector can serve as a night vision device.

In accordance with a further aspect of the present invention, the DNC are constituted of piezoelectric materials. When subject to pressure, light will be emitted which can be detected by a known light detector. A line of such NDC particles can serve as a pressure sensor which will not only indicate the application of pressure but also the position of the pressure application.

In accordance with still another aspect of the present invention, the DNC are constituted of a ferroelectric material. When a layer of such particles is subjected to an electric field, charges so generated can be stored as a memory device. Varying the voltage leads to transfer of the charges to the DNC, generating visible radiation that can be detected by a conventional light detector. A device combining the DNC pyroelectric layer with the light detector can serve as a non-volatile optical memory device.

The various features of novelty which characterize the invention are pointed out with particularity in the claims annexed to and forming a part of this disclosure.

For a better understanding of the invention, its operating advantages and specific objects attained by its use, reference should be had to the accompanying drawings and descriptive matter in which there are illustrated and described the preferred embodiments of the invention, in which drawings like references denote like or corresponding parts.

BRIEF DESCRIPTION OF THE DRAWINGS

FIGS. 13A–13D schematically illustrate how information is transferred in piezoelectric DNCs;

FIG. 14 shows a modified DNC piezoelectric particle;

FIG. 15 schematically illustrates one form of pressure-responsive detector in accordance with the invention;

FIG. 16 schematically illustrates another form of pressure-responsive detector in accordance with the invention;

FIG. 17 schematically illustrates one form of electric-field-responsive detector in accordance with the invention.

DETAILED DESCRIPTION OF THE PREFERRED EMBODIMENTS

Figure 1:
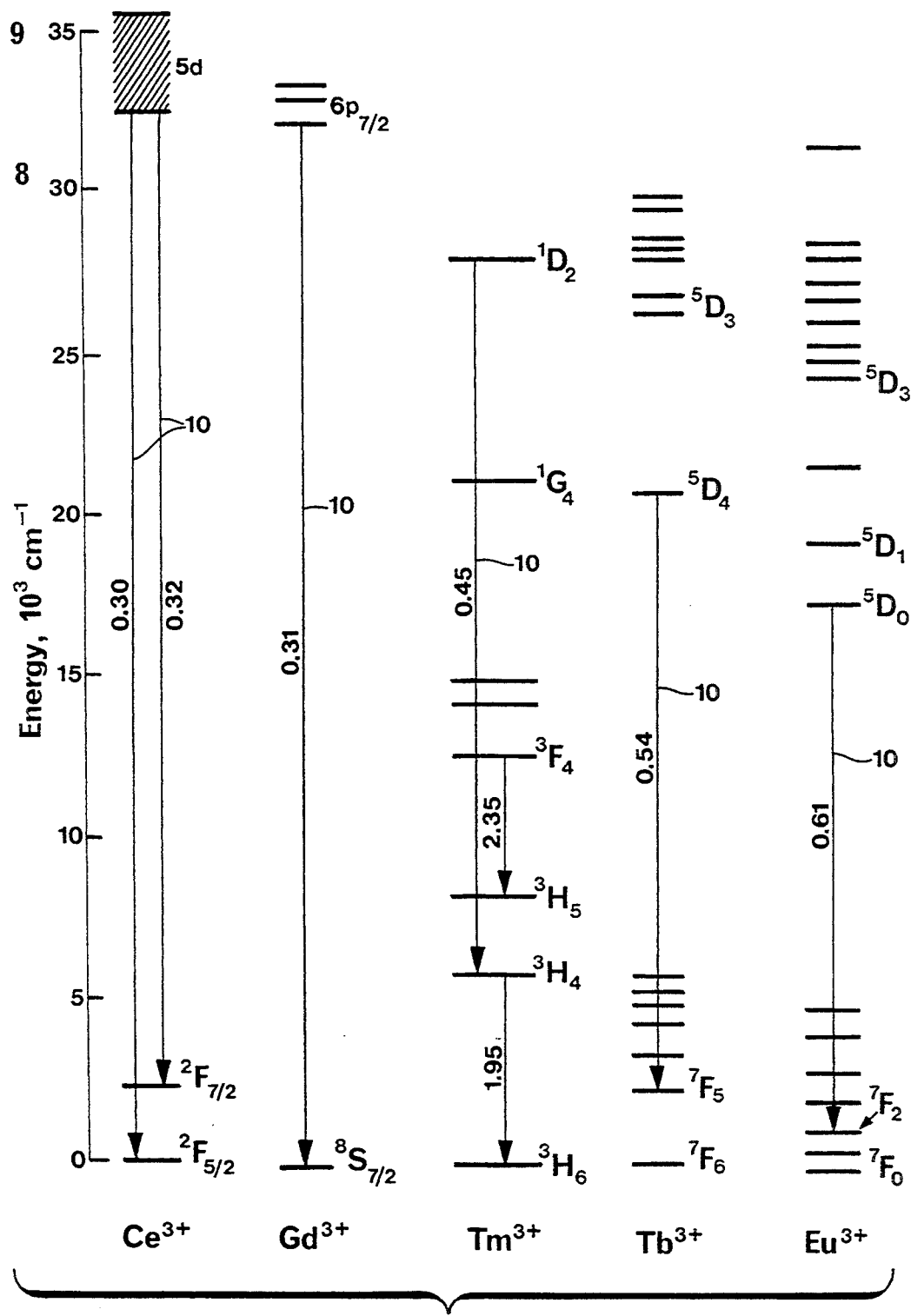
FIG. 1 illustrates band diagrams for five rare-earth dopants for use in DNCs in devices in accordance with the invention, indicating radiative transitions from excited levels.

DNC phosphors in this sensor application will provide ultra-fast and efficient phosphors which may not only be linear but super-linear. Since the DNC phosphors are ultra-fast, they do not show saturation of light output when irradiated. As the luminescent phosphor in these sensor applications, I prefer line emitting phosphors with rare-earth dopants due to their efficiency and narrow spectral distribution for better color purity. The majority of the dopants (also called activators from time to time) incorporated in DNC will be from rare-earth elements. FIG. 1 illustrates band diagrams for five of the rare-earth dopants. The atomic levels are as shown and labelled, and the arrows 10 indicate radiative transitions from excited levels. The energy jump indicates the wavelength of the resultant emitted photons. As shown in FIG. 1, the spectral range extends from UV (Ce, Gd), to blue (Tm), to green (Tb), and to red (Eu). Other rare earth ions such as Ho, Pr, Er and Yb can also be used for longer wave radiation. The transition metal impurities (Mn, Cu) and deep impurities (Ag, Au, etc.) can also be incorporated to obtain broad band emitting DNC phosphors.

To prepare efficient phosphors from DNC, preparation techniques are employed to ensure that, not only are small particles doped with an appropriate activator obtained, but they are also kept separated. As explained in the three related applications, whose contents are incorporated herein by reference, and in the references [5]–[7], whose contents are also incorporated herein by reference, the tiny nanometer particles must remain separated to exhibit the quantum-confined effects described herein. The chemical synthesis of DNC to achieve these results can rely on one of two possible mechanisms to limit the size of the crystallites: (A) the equilibrium size for the new phase (balancing free energy of a precipitated phase against the increased surface energy) is nanocrystalline-homogeneous growth, or (B) the new phase is grown at a low energy nucleation site within another material and the material size is limited by mass transport-heterogeneous growth. There are numerous reaction paths for both of these mechanisms which have been successfully applied, and these are included within the scope of this invention, Several of these techniques are listed below and are described in more detail in the related applications or reference as indicated, whose contents are also incorporated herein by reference:

1. Homogeneous precipitation at equilibrium in solution with reaction volume limited by micelles in solution in a volume limiting matrix (e.g. ion exchange resins, zeolites, porous glasses)([8] and references cited therein).

2. Reaction mediated molecular growth, such as molecular cluster synthesis (organometallic molecules forming inorganic cores) or polymer matrix reactions (e.g. ring-opening metathesis polymerization)([5]–[7] and references cited therein).

3. Heterogeneous growth, such as nucleation and growth of nanocrystalline phase on matrix sites, or diffusional growth by aggregation of chemically stable molecules within a matrix ([12] and references cited therein).

It will be appreciated that there are other publications referenced in the related applications that describe the preparation of undoped nanocrystals, but the same techniques with the modifications described in references [5]–[7] can be used to make the doped nanocrystals used in the invention.

As will be evident from the foregoing, DNCs are based on chemically preparing doped nanocrystalline particles of sizes preferably in the range of 2 to 5 nm of wide bandgap II–VI semiconductors and insulators using room temperature processing. As one example, which is not to be considered limiting, I have prepared manganese-doped zinc sulfide nanocrystals using mechanism A and technique 1 as follows. Diethylmanganese was synthesized first in a conventional manner and then mixed with diethylzinc in toluene solution. After addition of this solution to a hydrogen sulfide toluene solution, precipitation of the manganese-doped nanocrystals occurred. After centrifugation and subsequent rinsing of the particles, methacrylic acid and poly(methyl methacrylate) were used as surfactants to maintain the separation between the particles for quantum confinement. The surfactants allowed me to coat the surface of the particles and create a barrier for agglomeration and simultaneously provide surface passivation of the nanocrystalline particles. The other activators and hosts mentioned above can be made by similar techniques. This includes the preferred rare-earth dopants for visible light emitters. Thulium, terbium, and europium are the first three elements of choice. Their introduction can be similar to manganese doping in the zinc sulfide system Other techniques such as the preparation of rare earth doped nanocrystals of ZnS using organometallic synthesis as well as non-aqueous sol-gel processing or a combination of both is also considered within the scope of the invention. To prepare these materials a synthesis of intermediate, metastable compounds may have to be undertaken.

Figure 2:
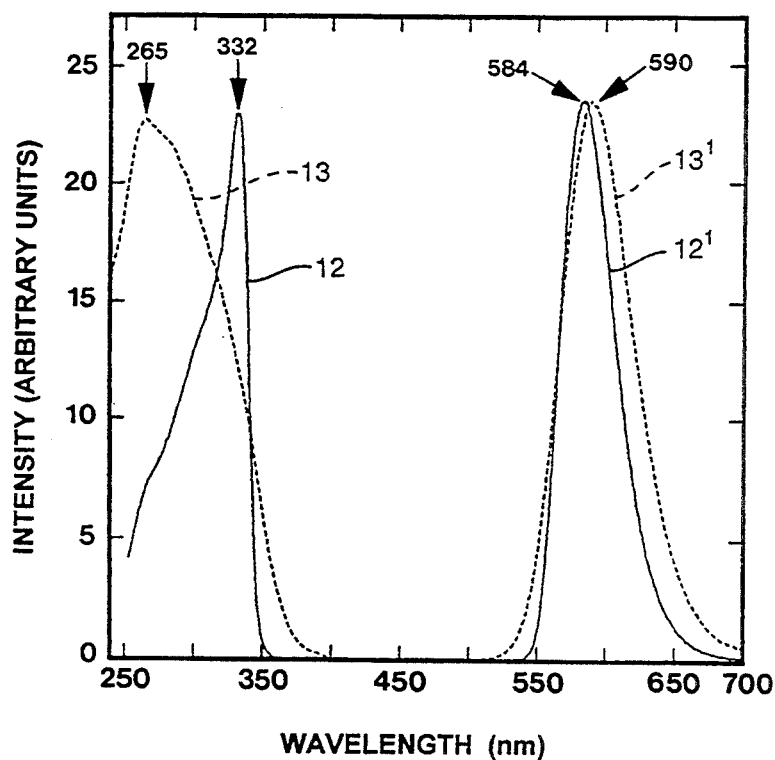
FIG. 2 shows the photoluminescent and photoluminescent excitation spectra and resultant emission spectra at room temperature of Mn-doped ZnS DNCs.

FIG. 2 shows some of the results obtained in DNC of Mn doped ZnS. FIG. 2 shows the photoluminescent (PL) 12 and photoluminescent excitation (PLE) 13 spectra and resultant emission spectra 12', 13' at room temperature.

Figure 3:
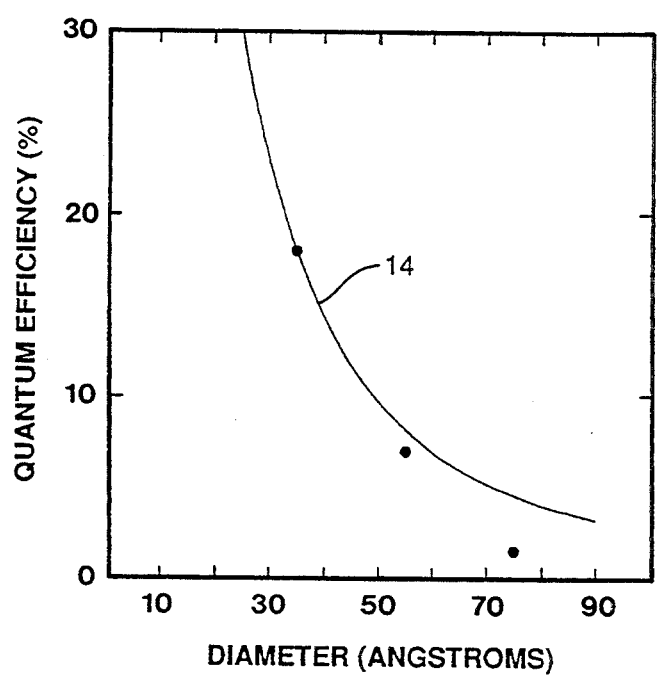
FIG. 3 shows the measured efficiency of the Mn-yellow emission and its strong dependence on the size of the Mn-doped ZnS nanocrystals.
Figure 4:
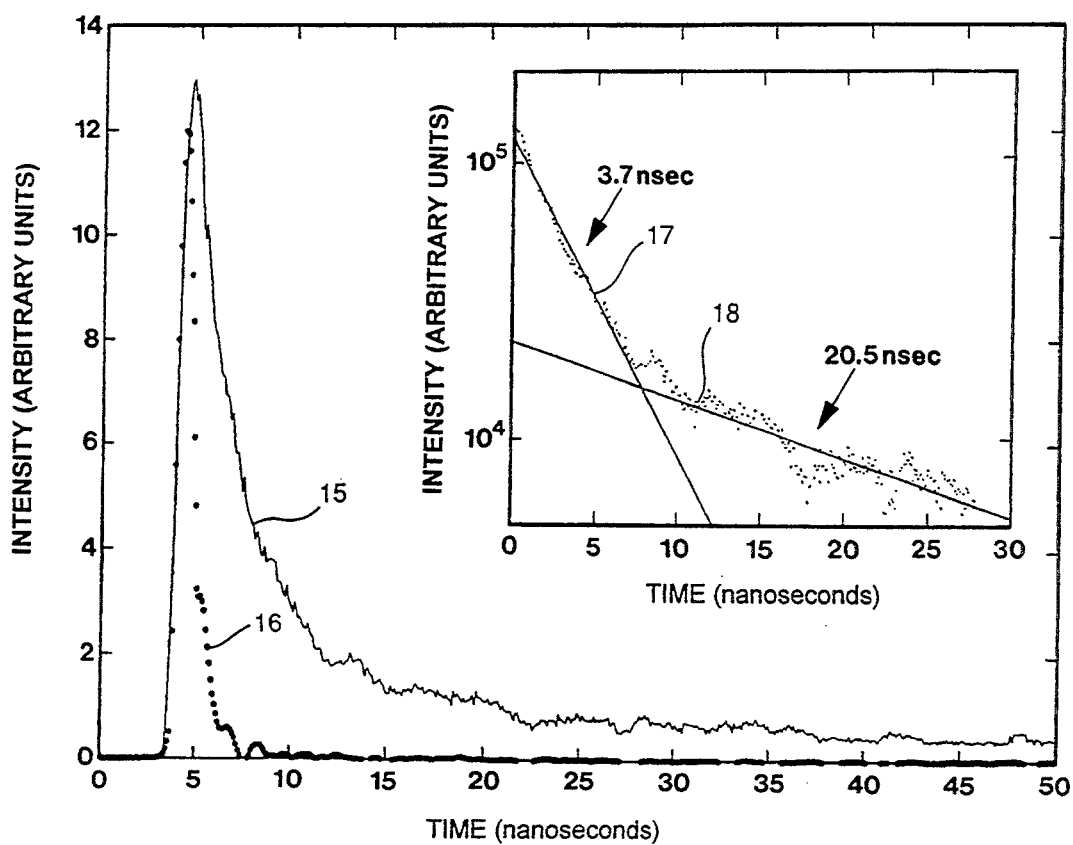
FIG. 4 shows in the main graph the transient yellow luminescence for 30 Å size particles, and its separation into its exponential decay components in the inset graph.
Figure 5:
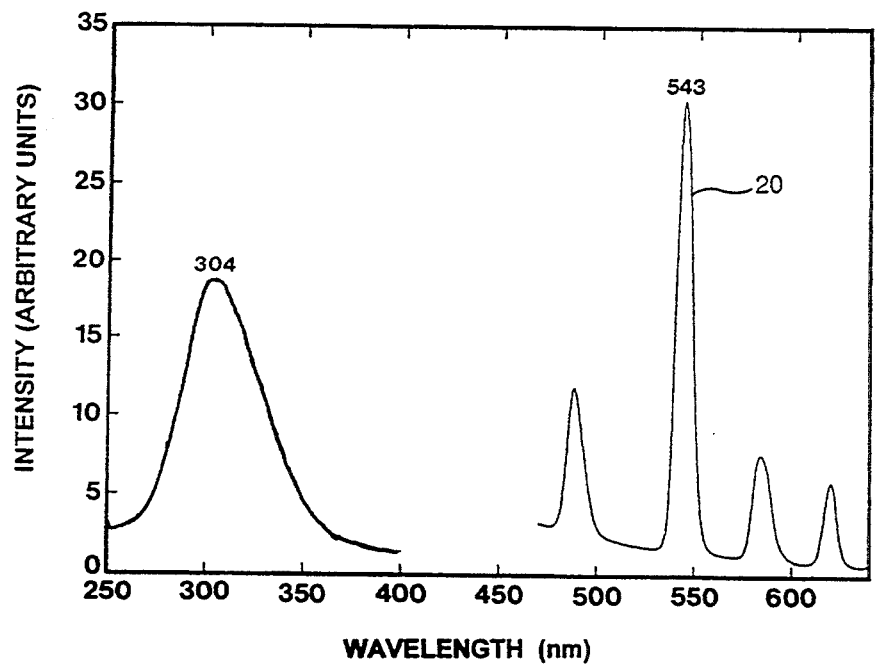
FIG. 5 shows the spectral output of $Tb^{3+}$ (green) in doped nanocrystals of ZnS in a polyethylene oxide matrix.

The spectra establish that the Mn-ion is an integral part of the ZnS nanocrystal. The measured efficiency of the Mn-yellow emission is over 20% at room temperature and strongly depends on the size of the nanocrystals, indicated by the curve 14 in FIG. 3 As the size of the nanocrystals decrease, the probability of electron and hole capture to the impurity increases and the e-h localization enhances the recombination rate via the impurity. Besides, the enhanced transfer rate from the host to the impurity, which has been measured, is less than 20 psec [7]. This is accompanied by simultaneous reduction in the radiative lifetime of Mn-ion emission. In bulk crystalline material, the partially spin-forbidden $Mn2+4T1-6A1$ transition has a lifetime of about 1.8 msec. In DNC produced as described above, I find dramatic shortening of this decay time by about six orders of magnitude. FIG. 4 shows the transient yellow luminescence 15 for 30 Å size particles, measured by exciting 16 the host ZnS nanocrystals above the bandgap by a picosecond pulsed laser. The time decay is separated into its exponential decay components 17, 18 in the inset graph. I have also produced $Tb^{3+}$ (green) in doped nanocrystals of ZnS in a polyethylene oxide matrix whose spectrum is shown in FIG. 5 at 20. The shift of the bandgap (332 to 304 nm) as measured from the PLE spectrum corresponds to particles of 60 A size.

These results are important in that:
1) a room temperature processing was used for phosphor preparation,
2) high luminescent efficiency was achieved upon impurity incorporation in these quantum confined nanocrystals,
3) the nanocrystalline phosphors so obtained are six orders of magnitude faster than the corresponding bulk phosphors,
4) the recombination (trapping) time for the free particles is less than 20 picoseconds,
5) these phosphors are characterized by controlled morphology and high purity.

As discussed above and shown in FIG. 4, the lifetime in ZnS:Mn nanocrystals is 3.7 nsec as compared to the bulk lifetime of 1.8 msec. The decay time measurements of the d-electron luminescence is consistent with a strong sp-d electron system in the nanocrystals. Given the high external quantum efficiency of the yellow emission, the extraordinary shortening in the d-electron decay time must include a significant degree of hybridization of the s-p host states with those of the d-electron. It is unlikely that modified crystal fields, given the proximity to a surface in a crystal, can alone be responsible for such admixing. Rather, I believe that the electronic confinement experienced by the s-p states and the corresponding increase in their spatial overlap with the localized d-electron states promotes the process of hybridization. An immediate benefit of the mixing is an enhanced energy transfer (capture) rate of the electron-hole pairs at the d-electron sites. The enhancement of efficiency in Mn doped ZnS nanocrystals is not only a consequence of the faster energy transfer to $Mn^{2+}$ ion but also ms connected with the change of the decay rate of Mn emission. The faster decay time as a result of strong sp-d mixing due to localization of electron and hole on $Mn^{2+}$, is necessary for this enhancement. If the lifetime of $Mn^{2+}$ emission remained as long as in the bulk crystal (1.8 msec), faster transfer rate would not result in high efficiency because light output would saturate at very low levels of excitation. The results obtained in ZnS:Mn nanocrystals can be extended to rare-earth doped ZnS nanocrystals, and I also expect the same lifetime changes in the internal transition of the rare-earth impurities. Indeed, in one of the samples of ZnS:Tb the lifetime was observed to be about 7 nsec as compared to ~3 msec in the bulk ZnS:Tb phosphor [6].

The capture/transfer rates of electrons into the rare-earth impurities will produce capture times in the range of 1 to 500 psec.

Sensors made with DNC particle layers possess the properties of converting the absorbed X-ray and UV radiation to a given visible light which can be easily detected by conventional detectors. This type of nanocrystalline sensor material, if deposited as a thin layer over a Si detector or its arrays, will allow the detection of high energy radiation without any loss of efficiency. The expected transitions in various rare-earth impurities when incorporated in nanocrystalline ZnS particles is shown in FIG. 1. The increase in the value of the band gap from bulk ZnS to nanocrystal ZnS is shown for 35 Å particles (in FIG. 2). The concept of converting high energy radiation to desirable visible radiation is also applicable to synchrotron radiation.

Figures 6A, 6B, 6C:
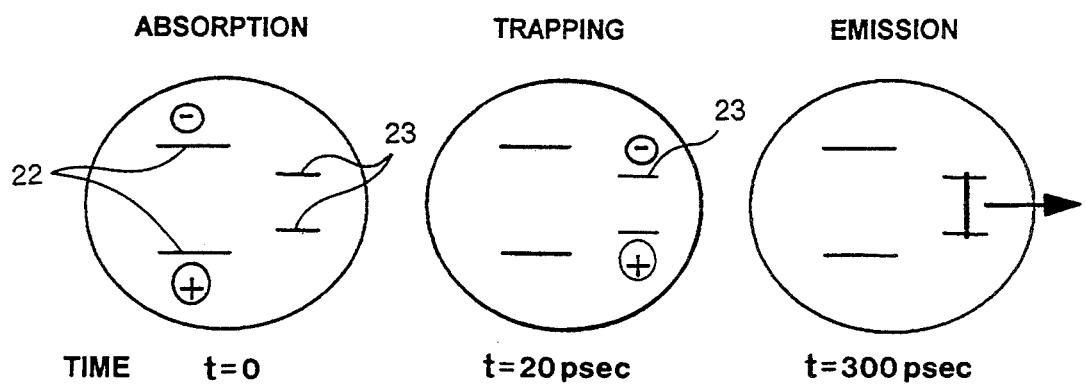
FIG. 6 shows in three figures the steps involved in recombination kinetics in DNCs.

The temporal process of detecting the X-Ray and UV radiation as described above can be represented schematically by FIG. 6. In a, the absorption and creation of electron-holes in the host 22 is shown at time t=0. The free carriers are transferred to impurity levels 23 probably via an excited state of the impurity. This capture process, as estimated from the recent measurements, occurs in less than 20 psec. This is depicted in b. The trapped carriers recombine very efficiently and currently we are measuring times as fast as 300 psec as shown in c.

When the probability of the excitation transfer and subsequent atomic emission exceeds the probability of hand-edge recombination and non-radiative surface recombination, the energy transfer efficiency increases and one can achieve very high emission efficiency at the wavelength of the impurity atom. The processes described above have been proven to occur in doped nanocrystals (DNC).

In sensors in accordance with the invention, efficient down-conversion of higher energy photons to lower energy photons is first achieved in doped nanocrystals and subsequently detected using conventional detectors. A significant advantage possessed by detectors in accordance with the invention over many other detectors is that the detectors are ultra-fast. This ultra-fast speed allows one to use known coincidence and gating techniques (see the description given in references [13–15]), which can lead to improvements in signal to noise ratio by several orders of magnitude. An example of one such detector system comprises a phosphor layer of DNC material and a sensor such as a Si-CCD array.

Essentially, the preferred detector embodiments of the invention for X-ray detection comprises only two separate components: the first converts all X-rays efficiently into visible radiation and the second one reads subsequently this spatially-resolved visible radiation by, for example, a CCD camera. This construction takes advantage of the preparation and properties of the first component which comprises a layer of doped nanocrystals as the ultrafast and sensitive layer. An important application is X-ray systems for mammography applications. For this purpose, X-ray sensitive materials are required, and preferred materials are high-atomic-number (Z) based compounds such as PbO and PbS. A preferred example is rare-earth doped PbO nanocrystals using room temperature preparation techniques.

Doped nanocrystals provide the following advantages in this application:

Absorbs the X-radiation efficiently in a thin layer of the host due to the large oscillator strength in a quantum dot [5].

Efficient and fast transfer of absorbed energy to the impurity.

Efficient emission of the characteristic emission of the impurity.

Figure 7:
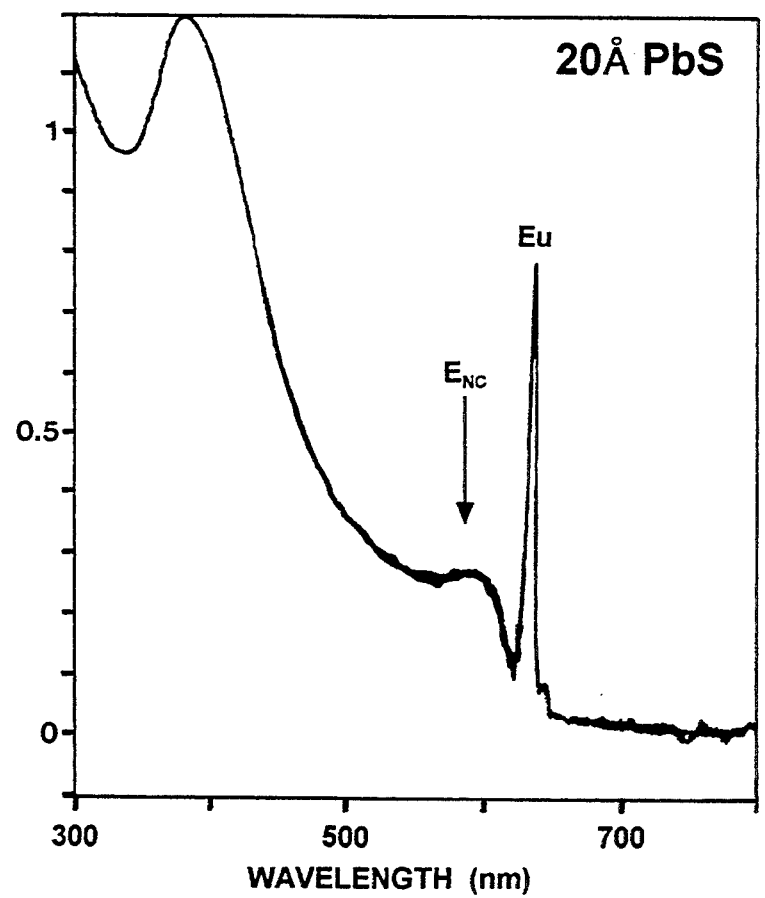
FIG. 7 shows the absorption peak observed in PbS DNCs.

The band gap $E_{NC}$ of such materials is expressed within the effective mass approximation by:

$$E_{NC} = E_g + \frac{h^2}{8R^2}[m_e^{-1} + m_h^{-1}] - \frac{1.8e^2}{\epsilon R}$$

where $E_g$ is the original band gap of the semiconductor while the second term is the change of energy due to quantum confinement (particle in a box). In this equation R is radius of the particle and $m_e$ and $m_h$ are the effective masses of the electron and hole, respectively. The last term is e–h correlation term which is small. FIG. 7 shows the absorption peak observed in PbS particle of 20 Å [6]. The band gap of 20 Å PbS particle has increased from a bulk value of 0.4 eV to 2.10 eV. Thus, the band gap of the PbS and PbO manocrystalline particles can be shifted to the visible region for which highly sensitive detectors are commercially available. For efficient and fast detection of absorbed radiation, an impurity is incorporated in the PbS or PbO which possesses an efficient internal transition. For this purpose, I prefer to incorporate Eu which emits at 610 nm (2.03 eV). This Eu emission is schematically represented in FIG. 7. The peak labelled $E_{NC}$ represents the energy band gap of the PbS-DNC.

I compared the ZnS:Mn DNC phosphors with a conventional P11 (ZnS:Ag) X-ray phosphor at λ=63.5 Å and the results are summarized below in the table.

| Phosphor | Size of Particles | Relative at λ = 63.5Å | Efficiency Luminescent Decay Time |
|---|---|---|---|
| ZnS:Ag P11 | ~10 μm | 3x | 20–80 μsec |
| ZnS:Mn DNC | 35 Å | 1x | 0.3–20 nsec |

It should be noted that the doped quantum dots show comparable efficiency to the bulk phosphors while their decay time is about four orders of magnitude faster. This ultra-fast luminescent property of the DNC materials will enable high resolution X-ray images at lower dosages.

A feature of the invention is that the small size of the DNC particles makes it very easy to produce thin layers of such materials by various known methods. The fast speed of the DNC materials allows the use of gated-coincidence techniques [14] to measure signals which under DC conditions are buried in the white noise. This coincidence method would help to reduce the X-ray dosage significantly.

Figure 8:
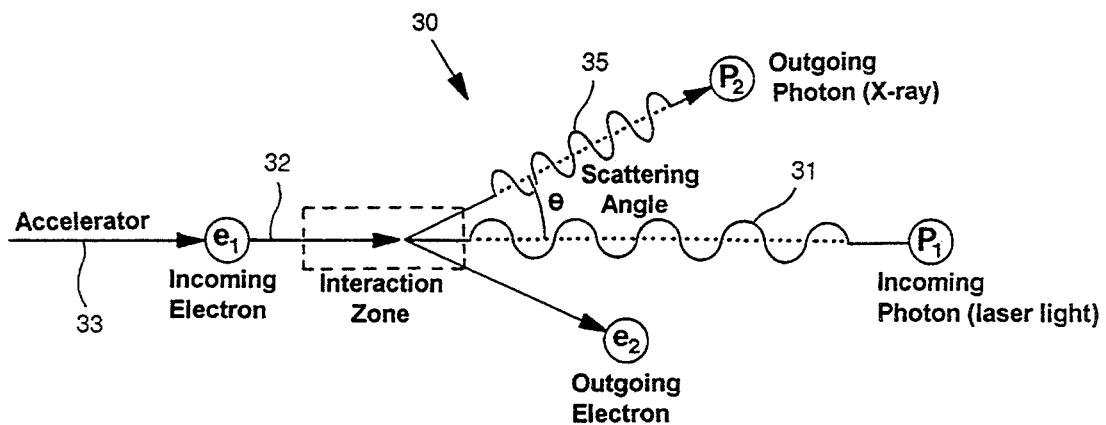
FIG. 8 is a schematic view of a pulsed X-ray source for use in a system in accordance with the invention.
Figure 9:
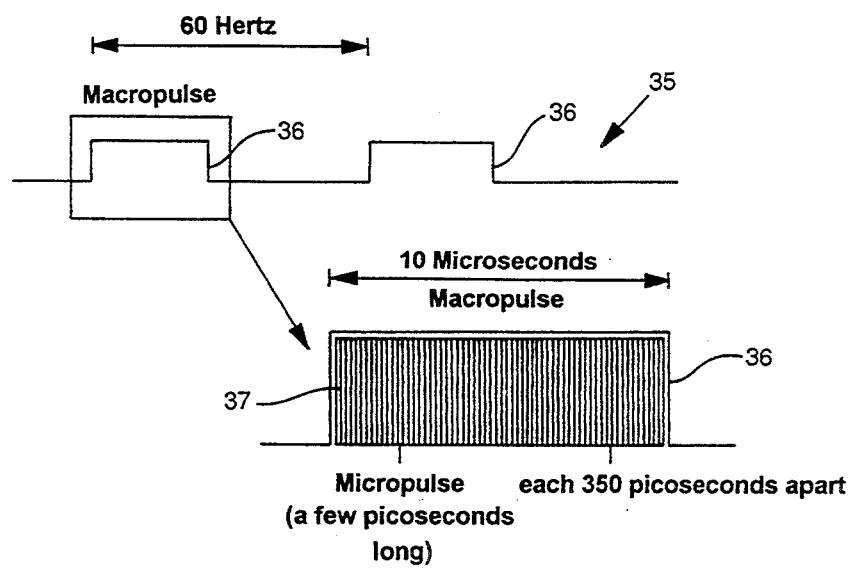
FIG. 9 illustrates schematically in a detail view the micropulse output of the source of FIG. 8.

Since the doped nanocrystal X-ray phosphors used in the invention are fast, then they can be used to detect short X-ray pulses. With a sufficiently fast speed, range finding techniques available with pulsed laser sources can be used. This is schematically represented in FIG. 8 with a free electron laser (FEL) for an X-ray imaging application. The FEL 30 uses a beam of relativistic electrons to amplify short-wavelength radiation by stimulated emission, and delivers an extremely high output in picosecond bursts that is tunable across the IR, visible, and UV spectrum. In a known application [13], the head on collision of an intense beam of laser light 31 with a high-energy electron beam 32 from, for example, an accelerator 33, produces an intense source of collimated pulsed X-ray beams 35, using the Compton Backscatter Effect. This generates (FIG. 9) highly directional, tunable, narrow-bandwidth, polarized X-rays which can cover a range of energies from 0.5 keV to 250 keV. In the FEL, the X-ray beam 35 comprises macropulses 36 each consisting of micropulses 37 of a few, e.g., 3, picoseconds duration at 350 picosecond intervals, spread over several microseconds, e.g., 10. Based on FIG. 1, the absorption of a wide range of excitation energies as exhibited by the FEL and their transfer or conversion to a narrow-line impurity emission easily detectable by conventional detectors will allow the detection of X-ray emission selectively and efficiently. This is particularly advantageous when rare-earth dopants, whose luminescence is due to atomic-like internal transitions, are used in the DNC host. Thus, efficient and ultra-fast transfer of X-ray radiation to rare-earth emission and detection of the resultant lumunescence using conventional silicon-based or equivalent detectors can be achieved. The absorption, transfer, and detection in ZnS:Mn in 300 psec has been achieved, and it will be possible to achieve recombination times of the order of 10 psec or less in rare-earth-doped DNC particle layers.

Figure 10:
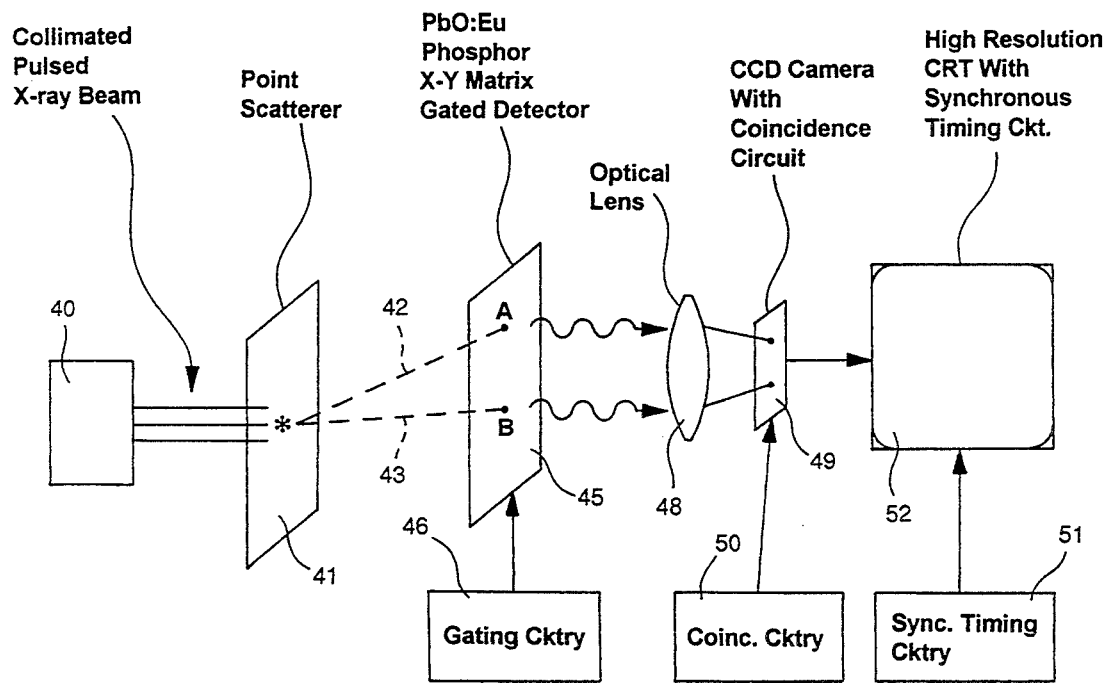
FIG. 10 schematically illustrates one form of 3-D X-ray system in accordance with the invention using the pulsed source of FIG. 8.

An important application of ultrafast X-ray detectors using DNC phosphors is 3-D imaging, one example of which is illustrated in FIG. 10. FIG. 10 schematically illustrates one such apparatus using range-finding techniques such as employed in Q-switched laser sources [15]. The apparatus comprises a conventional source 40, such as an FEL, of a collimated pulsed X-ray beam which is impinged on the object 41 to be imaged. Each point of the object scatters the X-rays in the beam producing scattered pulses shown at 42 and 43. The latter impinge on a sensor 45 according to the invention comprising a thin layer of PbO:Eu DNC phosphor forming an X-Y matrix which detects at points A and B the scattered pulses 42, 43. The sensor 45 is driven by conventional coincidence-gated circuitry 46 to improve the signal to noise ratio. The resultant visible light pulses are focussed by an objective lens 48 onto the sensitive screen of a conventional CCD camera 49 driven with conventional coincidence circuitry 50. The ouput electrical signal produced can be processed in conventional ways using synchronous timing circuitry 51 [14] to display on the screen of a high-resolution CRT 52 an image of the various points making up the point scatterer 41. Conventional gated signals are recovered using box-car integrators (available commercially from Princeton Applied Research Co. as Model 162). In effect, the CCD camera acts as a spatial detector mapped to the multiple sensors represented by the DNC screen 45. Conventional range-finding algorithms could be used to develop 3-D images as is used with Q-switched laser sources. See, for example, the detailed description given in references [15]. The system depends upon the use of detectors 45 which are faster than 10 psec in order to distinguish in time the scattered pulses at points A and B. Small DNC particles have this characteristic and make the system of FIG. 10 workable. The conventional algorithms can be used to extract 3-D images from the time-response data by well-known triangulation techiques to determine the side locations of the scattered X-rays. The gating and coincidence circuitry function to determine the distance or spacing between the A and B points. Descriptions of the gating circuitry suitable for use in the system of FIG. 10 and similar systems can be found in reference [14]. Descriptions of the coincidence circuitry suitable for use in the system of FIG. 10 and similar systems can be found in reference [14]. Descriptions of the synchronous timing circuitry suitable for use in the system of FIG. 10 and similar systems can be found in reference [14].

Figure 11:
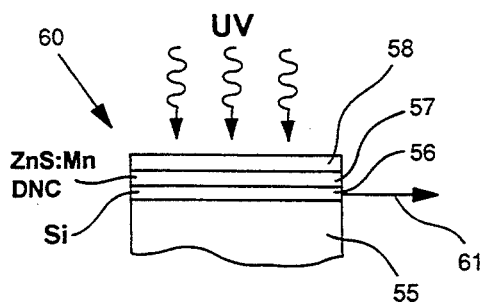
FIG. 11 schematically illustrates one form of UV detector in accordance with the invention.

Other applications of the novel DNC sensor screens are described below. FIG. 11 schematically illustrates an inexpensive and UV-sensitive detector, non-responsive to visible light, for detecting, for example, a flame in the presence of IR and visible light. The detector comprises substrate 55 on which is mounted a conventional Si detector 56 over which is mounted a thin layer of ZnS:Mn DNC, on top of which is provided an UV filter 58 to mask out all but UV radiation. The components 57 and 56 are shielded from external visible and UV radiation except that the Si detector 56 can detect and sense any visible radiation generated by the DNC sensor 57. UV radiation incident on the assembly 60 will pass through the UV filter 58 and impinge on the DNC UV sensor 57, and the resultant visible light will be detected by the Si detector 56 generating an electrical output signal 61. Instead of Mn-doped ZnS, Tb can be substituted as the dopant, which will generate light (FIG. 1) closer to the peak sensitivity of Si.

Figure 12:
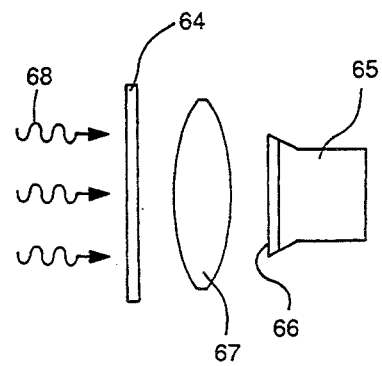
FIG. 12 schematically illustrates another form of X-ray/UV detector in accordance with the invention using a CCD camera.

FIG. 12 shows a variation in which a Si-based CCD camera 65 is substituted for the Si detector so as to produce a 2-D image of whatever radiation image is projected on the DNC screen 64 and the resultant visible image projected onto the CCD screen 66 by lens 67. The radiation image 68 can be UV or X-rays. By substituting a Cam-Corder for the CCD camera, and using an X-ray responsive screen 66, an inexpensive X-ray system results that can be used for diagnostic purposes or to detect fatigue and/or cracks in structures.

Similar constructions can be used as scintillators in various nuclear physics applications for γ-rays.

Other important applications of the DNC phosphors of the invention include piezoelectric- and pyroelectric-optical detectors. FIG. 15 schematically illustrates one form of piezoelectric-optical detector comprising a layer 81 of piezoelectric DNC particles 82 optically coupled to a light detector 83 which in turn generates an electrical signal upon the detection of light. Light will be generated by the piezoelectric layer in response to pressure 84 applied to the layer 81. The principle is illustrated in FIG. 13A which shows a single DNC particle 70 of any semiconductor or oxide material such as one of those previously mentioned surrounded by a shell 69 of piezoelectric material such as ZnO. The DNC core 70 is doped with an impurity such as Mn represented by the dot 71. Lines 72 and 73 represent the valence and conduction band edges, respectively. When pressure is applied to the piezoelectric particle 70, fixed positive and negative charges are generated at the surface as shown in FIG. 13B. The charges, represented by the +'s and −'s, due to the small size of the particles and thus the close proximity of the charges to the impurities, leak in to the DNC core 70 and are captured right away and excite the Mn-centers and appear as free electrons 75 and holes (FIG. 13C) in the conduction and valence bands, respectively. When the electrons decay down to the ground state or recombine with the holes (FIG. 13D), light (yellow for manganese) is generated in the same manner as described in connection with the previous figures. This light when detected by for example, a Si, detector, will generate an electrical signal whose intensity will reflect the intensity of the pressure applied. The main advantage is the high speed of the effects described, of the order of 300 or less picoseconds for DNC particles of 10–20 Å in size. Many other applications exist for this embodiment of the invention. For example, it can be used in toys, such as shoes that light up when a child wearing the shoes jumps, in baseballs (when built into the seams of the ball) to generate light when struck related to the power of the impact, as visible pressure detectors in tires by including in the valve different piezoelectric DNC particles emitting different colored light in response to different tire pressures, and in other practical applications to, for example, detect fractures of structural members. Other well-known piezoelectric materials can be substituted for the ZnO, such as AlN, PLZT, LiNbO$_3$, and LiTaO$_3$. The shell coating 69, which is very thin, is readily applied in the same manner as the polymer coating for the DNC particles as described in several of the referenced publications in the Appendix.

FIG. 14 illustrates a modification where the doped nanocrystalline/piezoelectric particle 69, 70 is coated with a thin passivating layer 79 of, for example, Y$_2$O$_3$. As illustrated in FIG. 15, the DNC 82 are embedded in a flexible matrix 81, such as PVC plastic, so that pressure applied to the matrix will be passed through to the particles 82. In a further modification illustrated in FIG. 16, the piezoelectric DNCs 86 are embedded in an optical fiber 85, for example of plastic. When pressure is applied, illustrated by the arrows, light is generated, shown by the small arrows, and that light is for the most part confined to the fiber 85 by total reflection from the fiber surfaces and can thus propagate down the fiber to a Si detector 87 at the right hand end.

The light when detected will generate an electrical signal from the detector. An important advantage, again, is speed, since the operation involves converting a slow acoustical wave into a fast optical wave. By using clusters of DNC particles doped with different impurities and distributed along the fiber, then light of different colors will be generated depending upon where the pressure is applied and which doped particles nearest to the pressure point are excited. By use of a detector 87 that can discriminate between the different colored light, it is possible to determine the point where the pressure was applied. An elongated configuration as that of FIG. 16 can thus serve in a robotic environment as the equivalent of a finger capable not only of determining the location of a pressure point but also the intensity of the pressure at the point.

Another embodiment taking advantage of the generation of charge on or in tiny DNCs and the dumping of the charge into the closely adjacent impurity dopant with its subsequent recombination to generate photons is the use of DNCs coated with a ferroelectric material, such as rare earth-doped PLZT, or $LiTaO_3$. In such materials, the presence of an electric field causes charges to be generated. The same mechanism as was described in connection with FIGS. 13–16 can be used for high-speed detection of electric fields in various applications where such information will prove useful. FIG. 17 shows one such device 90 comprising a plurality of ferroelectric coated DNCs 93 embedded in an insulating matrix 89 covered with spaced contacts or electrodes 91, 92. When a voltage is applied via terminals 94, the resultant electric field applied to the coated DNC particles 93 will be sensed by the generation of charge and light generated which when detected by the detector 95 will indicate the presence of the field and the intensity of the applied voltage.

By replacing the piezoelectric coated DNCs with pyroelectric coated DNCs, the pressure sensor is converted into a heat sensor which will detect the presence of heat by generating light in the same manner as described in connection with the piezoelectric coated DNCs. Examples of suitable pyroelectric materials are $LiTaO_3$, and TGS(triglycene sulphate).

DNC phosphor layers are readily prepared in conventional ways. For example, the nanocrystalline powders made as described above can be suspended in polyvinyl alcohol and ammonium dichromate solution and applied as a coating to a suitable support, using conventional coating techniques, such as spin-coating, or aerosol-spray. A layer thickness below 1000 Å for most of the applications described herein is preferred. However, in the case of the detection of higher-energy radiation, the thickness can be increased to the order of 10,000Å.

It will also be understood that the invention is not limited to the optical geometries illustrated and other optical geometries can be substituted.

While the invention has been described in connection with preferred embodiments, it will be understood that modifications thereof within the principles outlined above will be evident to those skilled in the art and thus the invention is not limited to the preferred embodiments but is intended to encompass such modifications.

APPENDIX

References

[1] C. G. Young, Appl. Opt., 5, 993 (1966)

[2] N. A. Kozlov, A. A. Mak, B. M. Sedov, Sov. J. Opt. Techn., 33, 549 (1966)

[3] J. Falk, L. Huff, J. P. Taynai, "Solar-pumped, mode-locked, frequency doubled Nd:Yag laser", Conf. on Laser Eng. and Appl., Washington, DC (1975)

[4] D. Pruss, G. Huber, A. Beimowski, Appl. Phys. B 28, 355 (1982)

[5] R. N. Bhargava, D. Gallagher, X. Hong, and A. Nurmikko; Phys. Rev. Lett. 72,416 (1994).

[6] R. N. Bhargava, D. Gallagher, and T. Welker; J. of Luminescence 60&61, 275 (1994).

[7] D. Gallagher, W. Heady, J. Racz, and R. N. Bhargava; J. of Crystal Growth 138, 970 (1994).

[8] P. Klein, T. Norris, R. N. Bhargava and D. Gallagher (to be published).

[9] L. Brus, J. Phys. Chem. 90. 2555 (1986)

[10] Y. L. Soo, Y. H. Kao, R. N. Bhargava and D. Gallagher (to be published).

[11] R. C. Ropp, "Luminescence And The Solid State", Publ. Elsevier, New York, 1991, Ch. 9, Pgs. 361-411.

[12] P. A. Biaconi. J. Lin, and A. R. Strzelecki, Nature, Vol. 349, P. 315, (1991).

[13] F. E. Carroll et al., Investigative Radiology, 25, 465 (1990).

[14] Princeton Applied Research Co. (Model 162).

[15] W. Koechner, "Solid-State Laser Engineering", Publ. Springer-Verlach, Berlin, (1992).

What is claimed is:

1. A solid-state sensor comprising:
    (a) a layer of doped nanocrystals doped with an activator,
    (b) said doped nanocrystals having an energy band structure due to quantum confinement,
    (c) said activator having atomic energy levels such that excited carriers can transfer to said atomic energy levels and upon recombination will generate photons,
    (d) means for detecting the photons generated by the activator.

2. A solid-state sensor as claimed in claim 1, wherein the doped nanocrystals comprise separated particles having a particle size smaller than about 100 Å.

3. A solid-state sensor as claimed in claim 2, wherein the doped nanocrystals are of materials selected from the group consisting of wide band gap semiconductors and insulators.

4. A solid-state sensor as claimed in claim 3, wherein the doped nanocrystal materials are selected from the group consisting of ZnO, ZnS, ZnSe, CdS, CdSe, $Y_2O_3$, $Y_2OS$, PbS, and PbO.

5. A solid-state sensor as claimed in claim 3, wherein the activators are selected from the group consisting of rare earth ions and transition metal ions.

6. A solid-state sensor as claimed in claim 5, wherein the photons generated by the activators are in the visible spectral range, and the means for detecting the photons comprises a visible light detector.

7. A solid-state sensor as claimed in claim 6, wherein the visible light detector is Si-based or III-V compound-based.

8. A solid-state sensor as claimed in claim 1, wherein the doped nanocrystals are in the form of a thin layer positioned close to the means for detecting.

9. A solid-state sensor as claimed in claim 8, wherein the means for detecting is a Si detector or a Si CCD camera.

10. A solid-state sensor as claimed in claim 9 for UV detection, wherein the thin layer is less than 1000 Å thick.

11. A solid-state sensor as claimed in claim 9 for X-ray detection, wherein the thin layer is less than 10,000 Å thick.

12. A solid-state X-ray detector comprising:
(a) a layer of doped nanocrystals of a high Z material doped with an activator,
(b) said doped nanocrystals having an energy band structure due to quantum confinement and producing excited carriers in response to incident X-rays,
(c) said activator having atomic energy levels such that excited carriers can transfer to said atomic energy levels and upon recombination will generate visible photons,
(d) a visible light detector means for detecting the photons generated by the activator.

13. A solid-state detector as claimed in claim 12, wherein the high Z material is PbO or PbS.

14. A solid-state detector as claimed in claim 12, wherein the activator is a rare earth element.

15. An X-ray imaging device comprising:
(a) an X-ray beam source comprising macropulses each comprising short micropulses in the picosec. range,
(b) an object to be imaged in the beam path, each point of the object scattering the X-ray micropulses,
(c) a solid state screen positioned to intercept the scattered micropulses, said screen comprising a layer of doped nanocrystals of a high Z material doped with an activator, said doped nanocrystals having an energy band structure due to quantum confinement and producing excited carriers in response to incident X-rays, said activator having atomic energy levels such that excited carriers can transfer to said atomic energy levels and upon recombination will emit visible photons,
(d) means for detecting the photons and for determining the screen locations where photons are emitted.

16. An X-ray imaging device as claimed in claim 15, wherein the means for detecting and for determining of claim element d comprises gating circuitry connected to the solid state screen.

17. An X-ray imaging device as claimed in claim 15, wherein the means for detecting and for determining of claim element d comprises coincidence circuitry connected to the means for detecting.

18. An X-ray imaging device was claimed in claim 17, wherein the means for detecting comprises a CCD camera.

19. An X-ray imaging device as claimed in claim 18, further comprising a high resolution display device connected to the CCD camera and synchronous timing circuitry connected to the display device.

20. A solid-state sensor comprising:
(a) a layer comprising doped nanocrystals doped with an activator,
(b) said doped nanocrystals having an energy band structure due to quantum confinement,
(c) said activator having atomic energy levels such that excited carriers can transfer to said atomic energy levels and upon recombination will generate visible photons,
(d) means for detecting the photons generated by the activator,
(e) said doped nanocrystals creating excited carriers in response to UV, X-rays, pressure, heat, or an electric field.

21. A solid-state sensor as claimed in claim 20, wherein the doped nanocrystals comprise a piezoelectric material coating.

22. A solid-state sensor as claimed in claim 21, wherein the doped nanocrystals are each coated with a thin layer of a charge-generating material.

23. A solid-state sensor as claimed in claim 21, wherein the doped nanocrystals are embedded in a optical fiber.

24. A solid-state sensor as claimed in claim 21, wherein the doped nanocrystals are embedded in a flexible pressure-responsive matrix.

25. A solid-state sensor as claimed in claim 20, wherein the doped nanocrystals comprise a ferroelectric material coating.

26. A solid-state sensor as claimed in claim 20, wherein the doped nanocrystals comprise a pyroelectric material coating.

* * * * *